United States Patent
Qi et al.

(10) Patent No.: US 9,847,427 B2
(45) Date of Patent: Dec. 19, 2017

(54) ARRAY SUBSTRATE, METHOD FOR FABRICATING THE SAME, AND DISPLAY DEVICE

(71) Applicant: BOE TECHNOLOGY GROUP CO., LTD., Beijing (CN)

(72) Inventors: Yonglian Qi, Beijing (CN); Shi Shu, Beijing (CN); Chuanxiang Xu, Beijing (CN); Feng Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/098,519

(22) Filed: Apr. 14, 2016

(65) Prior Publication Data

US 2016/0315103 A1   Oct. 27, 2016

(30) Foreign Application Priority Data

Apr. 24, 2015   (CN) .......................... 2015 1 0202417

(51) Int. Cl.
*H01L 29/786*   (2006.01)
*H01L 27/12*    (2006.01)

(52) U.S. Cl.
CPC ...... *H01L 29/78645* (2013.01); *H01L 27/124* (2013.01); *H01L 29/78633* (2013.01)

(58) Field of Classification Search
CPC ........... H01L 27/1222; H01L 29/78633; H01L 29/78618; H01L 29/78645; H01L 27/1259; H01L 27/124; H01L 27/3248; H01L 29/41733; H01L 29/66765; H01L 27/1225;

(Continued)

(56) References Cited

U.S. PATENT DOCUMENTS

2006/0001091 A1* 1/2006 Kim ................. H01L 27/12
                                                    257/347
2012/0262642 A1* 10/2012 Ikeda ................ H01L 27/124
                                                    349/46

FOREIGN PATENT DOCUMENTS

CN       1716637 A     1/2006
CN     101021658 A     8/2007
CN     103247659 A     8/2013

OTHER PUBLICATIONS

First Office Action dated Apr. 28, 2017 corresponding to Chinese application No. 201510202417.0.

* cited by examiner

*Primary Examiner* — David Vu
*Assistant Examiner* — Mouloucoulaye Inoussa
(74) *Attorney, Agent, or Firm* — Nath, Goldberg & Meyer; Joshua B. Goldberg; Christopher Thomas

(57) ABSTRACT

An array substrate and a method for fabricating the same, and a display device are disclosed. The array substrate comprises light-transmissive regions for display and shading regions, a plurality of thin film transistors are provided in the shading region, the thin film transistor comprises: a base substrate; an active layer, a gate insulating layer, a gate and a passivation layer sequentially provided on the base substrate; and a source and a drain provided on the passivation layer, the source and the drain comprise a conductive shading layer connected to the active layer and a copper layer provided on the conductive shading layer, the conductive shading layer is provided between the active layer and the copper layer, and at least a part of region of the shading region other than the source and the drain is provided with the conductive shading layer.

15 Claims, 2 Drawing Sheets

(58) Field of Classification Search
CPC .............. H01L 27/3262; H01L 27/3258; G02F 1/1368; G02F 1/136209; C30B 1/023
USPC ......... 349/46, 56; 257/347, 59; 438/34, 166, 438/486, 795
See application file for complete search history.

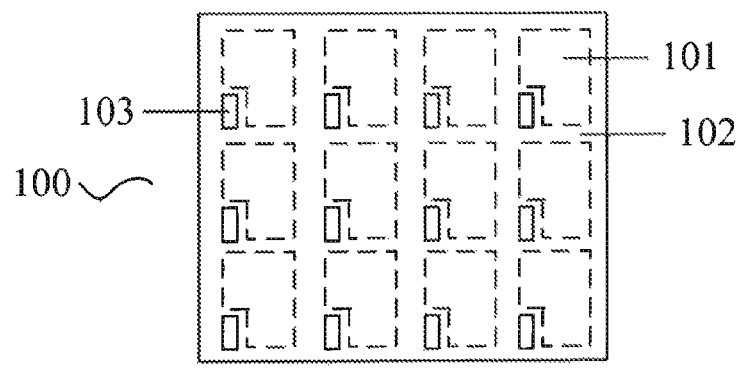
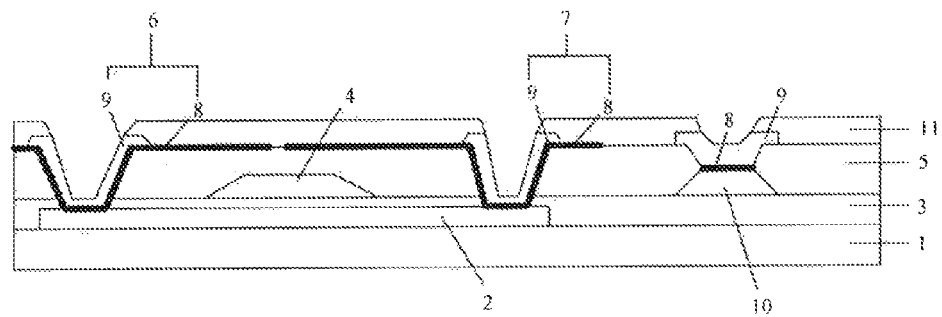
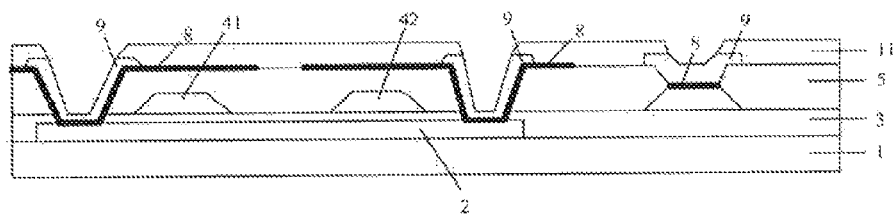

ARRAY SUBSTRATE, METHOD FOR FABRICATING THE SAME, AND DISPLAY DEVICE

CROSS-REFERENCE TO RELATED APPLICATION

This application claims priority to Chinese Patent Application No. 201510202417.0, filed on Apr. 24, 2015, the contents of which are incorporated by reference in the entirety.

FIELD OF THE INVENTION

The present invention relates to the field of display technology, and particularly, relates to an array substrate, a method for fabricating the same, and a display device.

BACKGROUND OF THE INVENTION

An array substrate is a necessary component of a display panel such as a liquid crystal display (LCD) panel, etc. Generally, an array substrate is provided with a base substrate, on which thin film transistors, scan lines, data lines, pixel electrodes, a passivation layer, and a black matrix are formed. A gate and a source of each thin film transistor are connected to the scan line and the data line, respectively, and a drain of the thin film transistor is connected to the pixel electrode. In an array substrate, regions where the pixel electrodes are located are used for display, and are thus used as light transmissive regions; regions where the thin film transistors between the pixel electrodes, the scan lines, and the data lines are located cannot be used for display, and are thus used as shading regions, it is necessary to provide a black matrix in the shading region to avoid decrease in image contrast. Therefore, during fabricating process, the step of providing a black matrix layer will be additionally added to the fabricating process.

In addition, when fabricating the source and the drain, copper is usually used as the material of the source and the drain. A phenomenon that copper atoms diffuse into an active layer is likely to occur when the copper is in contact with the active layer, which reduces the performance of the active region. In particular, in a case where polysilicon is used as the material of the active layer, copper diffusion is even more obvious. In order to prevent the copper atoms from diffusing, a titanium layer, which located between the copper layer and the active layer, is further provided at the positions of the source and the drain.

SUMMARY OF THE INVENTION

A technical problem to be solved by embodiment of the present invention comprises preventing a fabricating process from being complicated caused by disposing a black matrix layer on the array substrate and preventing copper atoms from diffusing into an active layer.

Embodiments of the present invention provide an array substrate comprising light-transmissive regions for display and shading regions, a plurality of thin film transistors are provided in the shading regions, the thin film transistor comprises: a base substrate; an active layer, a gate insulating layer, a gate and a passivation layer sequentially provided on the base substrate; and a source and a drain provided on the passivation layer, the source and the drain comprise a conductive shading layer connected to the active layer and a copper layer provided on the conductive shading layer, the conductive shading layer is provided between the active layer and the copper layer, and at least a part of region of the shading region other than the source and the drain is provided with the conductive shading layer.

At least a part of region above the active layer may be provided with the conductive shading layer.

The conductive shading layer may comprise: a source portion corresponding to the source; a drain portion corresponding to the drain; a source extending portion extending from the source portion; and a drain extending portion extending from the drain portion.

In the conductive shading layer above the active layer, there may be an interval between the source extending portion connected to the source and the drain extending portion connected to the drain.

The source extending portion and the drain extending portion may function as a black matrix of the array substrate.

The gate may comprise a first gate and a second gate, and the conductive shading layer is provided above each of the first gate and the second gate.

There may be an interval between the conductive shading layer provided above the first gate and the conductive shading layer provided above the second gate, and the interval is located between the first gate and the second gate.

The shading region may be further provided with wirings therein, and at least a part of region above the wirings is provided with the conductive shading layer.

The copper layer may have the same pattern as the conductive shading layer.

The conductive shading layer may comprise titanium.

The active layer may comprise polysilicon.

The array substrate may further comprise a color filter layer provided at least in the light-transmissive regions.

The embodiment of the present invention further provides a method for fabricating an array substrate, the array substrate comprises light-transmissive regions for display and shading regions, the method comprises forming thin film transistors on the shading region of a base substrate of the array substrate, the thin film transistor comprises an active layer, a gate insulating layer, a gate and a passivation layer sequentially provided on the base substrate, and a source and a drain provided on the passivation layer, wherein the source and the drain comprise a conductive shading layer connected to the active layer and a copper layer provided on the conductive shading layer, the conductive shading layer is provided between the active layer and the copper layer, and at least a part of region of the shading region other than the source and the drain is provided with the conductive shading layer.

In the method, the conductive shading layer may have the same pattern as the copper layer, and the conductive shading layer and the copper layer may be formed by one patterning process.

The embodiment of the present invention further provides a display device including the above described array substrate.

In the array substrate according to the embodiments of the present invention, the source and the drain comprise the conductive shading layer and the copper layer provided on the conductive shading layer, since the conductive shading layer functions as portions of the source and the drain, a direct contact between the copper layer and the active region may be avoided, so as to prevent the copper atoms from diffusing into the active layer, and the conductive shading layer also reinforces adhesive property of the copper layer, so as to prevent the copper layer from falling off. Meanwhile, the conductive shading layer further comprises extending portions provided in the shading region and extending beyond the source and the drain, these portions of the conductive shading layer may function as a black matrix layer for shading light, to prevent color mixture among color filters, and thus there is no need to additionally add a step of fabricating a black matrix layer during the fabricating.

The method for fabricating an array substrate according to embodiments of the present invention may effectively prevent copper atoms from diffusing into the active layer, and also omit the step of fabricating a black matrix layer, which simplifies the fabricating process.

BRIEF DESCRIPTION OF THE DRAWINGS

FIG. 1 is a schematic plan view of an array substrate according to an embodiment of the present invention.

FIG. 2 is a schematic cross-sectional view of an array substrate according to an embodiment of the present invention.

FIG. 3 is a schematic cross-sectional view of an array substrate according to an embodiment of the present invention.

DETAILED DESCRIPTION OF THE EMBODIMENTS

Figure 4:
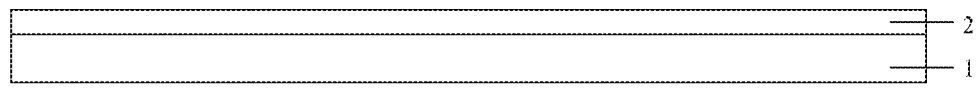
FIG. 4 is a schematic view of a structure formed after step S1 is finished in a method for fabricating an array substrate according to an embodiment of the present invention.

To provide a better understanding of the technical solution of the present invention for those skilled in the art, the present invention will be further described in detail with reference to the accompanying drawings and the detailed description.

Embodiments of the present invention provide an array substrate, and FIG. 1 shows a schematic plan view of the array substrate. As shown in FIG. 1, the array substrate comprises light-transmissive regions 101 for display and shading regions 102 other than the light-transmissive regions 101, a plurality of thin film transistors 103 are provided in the shading regions 102.

FIG. 2 is a schematic cross-sectional view of an array substrate according to the embodiment of the present invention. As shown in FIG. 2, the thin film transistor 103 may comprise: a base substrate 1; an active layer 2, a gate insulating layer 3, a gate 4 and a passivation layer 5 sequentially provided on the base substrate 1; and a source 6 and a drain 7 provided on the passivation layer 5. Each of the source 6 and the drain 7 comprises a conductive shading layer 8 and a copper layer 9 provided on the conductive shading layer 8. The conductive shading layer 8 is also provided in at least a portion of regions of the shading region 102 other than the source 6 and the drain 7.

In addition, contact holes are provided in the gate insulating layer 3 and the passivation layer 5, so as to connect the source 6 and the drain 7 to the active layer 2 through the contact holes.

In the embodiments of the present invention, the light-transmissive region 101 refers to a region used for display and corresponding to the pixel electrode. In addition, the shading region 102 refers to a region located outside the pixel electrode and provided therein with structures such as thin film transistors 103, wirings 10, etc., and since no pixel electrode is provided in the shading region 102, the shading region 102 cannot display directly, and light emitted therefrom should be shaded.

In the array substrate 100 of the embodiment of the present invention, the source 6 and the drain 7 comprise a conductive shading layer 8 and a copper layer 9 provided on the conductive shading layer 8, and at least a portion of region of the shading region 102 other than the source 6 and the drain 7 is also provide with the conductive shading layer 8. That is, portions of the conductive shading layer 8 serving as the source 6 and the drain 7 (i.e., portions corresponding to the source 6 and the drain 7, referred to as a source portion and a drain portion) may avoid direct contact between the copper layer 9 and the active layer 2, so as to prevent the copper from diffusing into the active layer 2, and moreover, the conductive shading layer 8 also reinforces adhesive property of the copper layer 9, so as to prevent the copper layer 9 from falling off. In addition, the conductive shading layer 8 further comprises portions provided in the shading region and extending beyond the source 6 and the drain 7 (i.e., portions extending outside from the source portion and the drain portion, and referred to as a source extending portion and a drain extending portion), and these portions of the conductive shading layer 8 can further serve as a black matrix layer for shading light, so as to avoid color mixture among color filters, and thus, there is no need to additionally add a step of fabricating a black matrix layer during the fabricating process.

In some embodiments, at least a portion of the region above the active layer 2 is provided with the conductive shading layer 8 therein. That is to say, the portions of the conductive shading layer 8 extending beyond the source 6 and the drain 7 (i.e., the extending portions) are provided at least in portions of the region above the active layer 2, so as to function as the "black matrix" in the region.

In some embodiments, in the region of the conductive shading layer 8 other than the portions corresponding to the source 6 and the drain 7, one part of the conductive shading layer 8 is connected to the source 6, the other part thereof is connected to the drain 7, and there is an interval between the two parts of the conductive shading layer 8 respectively connected to the source 6 and the drain 7. That is to say, the portions of the conductive shading layer 8 extending beyond the source 6 and the drain 7 may directly extend from the source 6 and the drain 7, and since the source 6 and the drain 7 cannot be electrically connected, the portions of the conductive shading layer 8 connected to the source 6 and the drain 7 should be spaced apart from each other (i.e., there is an interval between the portions). It should be understood that there is no black matrix provided at the position of the interval, light leakage may occur, however, since the interval may be designed very slim, light leakage caused therefrom may be negligible.

In some embodiments, the shading region 102 may be further provided with wirings 10, and at least a portion of region above the wiring 10 is provided with the conductive shading layer 8. That is to say, the portions of the conductive shading layer 8 extending beyond the source 6 and the drain 7 (i.e., the extending portion) may be provided above the wirings 10 to cover the wirings 10, so as to avoid reduction in image contrast. In some embodiments, the wirings 10 may comprise scan lines, gate lines, etc.

As shown in FIG. 2, the array substrate 100 of the embodiment of the present invention may adopt a top-gate structure (i.e., the gate 4 is provided above the active region 2), such structure requires fewer photolithographic processes, which further simplifies the fabricating process.

In some embodiments, patterns of the copper layer 9 and the conductive shading layer 8 may be the same. In the process of forming the copper layer 9 and the conductive shading layer 8 having the same pattern, firstly, one layer of a conductive shading material is formed, and one layer of copper is formed, and then, the conductive shading layer 8 and the copper layer 9 are exposed and etched together. In this way, one patterning process can be omitted, which causes the fabricating process to be easier.

In some embodiments, the conductive shading layer 8 may comprise titanium. Nevertheless, the material of the conductive shading layer 8 is not limited to titanium, other metal having a low transmissivity (a transmissivity less than 50%) and capable of preventing copper from diffusing may also be used as the material of the shading conductive layer 8.

In some embodiments, the active layer 2 may comprise polysilicon. The step of forming an active layer 2 that uses polysilicon as a material thereof comprises: depositing an amorphous silicon layer on the base substrate; performing high-temperature dehydrogenation; forming a polysilicon layer through excimer laser annealing; and forming a pattern of the active layer by a patterning process. Although copper is very likely to diffuse into polysilicon material, the copper diffusion may be effectively prevented in the array substrate of the embodiments of the present invention.

In some embodiments, the array substrate 100 further comprises a color filter layer 11, the color filter layer 11 is provided at least in the light-transmissive regions 101. By disposing the color filter layer 11 on the array substrate 100, there is no need to perform a aligning and assembling process, and the aperture ratio may be increased.

FIG. 3 is a schematic cross-sectional view of an array substrate according to an embodiment of the present invention. As shown in FIG. 3, two gates are provided in the array substrate, and the other structures of the array substrate are similar to those of the array substrate of FIG. 2.

That is to say, as shown in FIG. 3, two gates spaced apart are provided above one active region, and the source 6 and the drain 7 are provided at outer sides of the two gates, respectively. Since the active region is covered by the gate insulating layer 3 and the passivation layer 5, contact holes may be provided in the gate insulating layer 3 and the passivation layer 5, such that the source 6 and the drain 7 are connected to the active layer 2 through the contact holes.

Referring to FIG. 3, the gate comprises a first gate 41 and a second gate 42, the conductive shading layer 8 is provided above each of the first gate 41 and the second gate 42, and the interval between the portions of the conductive shading layer 8 connected to the source 6 and the drain 7 is located between the first gate 41 and the second gate 42.

That is to say, the portions of the conductive shading layer 8 extending beyond the source 6 and the drain 7 are provided above the first gate 41 and the second gate 42, and the interval between the two portions of the conductive shading layer 8 is right located between the two gates.

Embodiments of the present invention further provide a method for fabricating an array substrate, and the method comprises: fabricating thin film transistors 103 in shading regions 102 of a base substrate 1 of the array substrate 100. The thin film transistor 103 comprises an active layer 2, agate insulating layer 3, agate 4 and a passivation layer 5 sequentially provided on the base substrate 1, and a source 6 and a drain 7 provided on the passivation layer 5. Each of the source 6 and the drain 7 comprises a conductive shading layer 8 and a copper layer 9 provided on the conductive shading layer 8. At least a part of region of the shading region 102 other than the source 6 and the drain 7 is provided with the conductive shading layer 8.

Referring to FIG. 4 to FIG. 8, the method comprises the following steps S1 to S5.

As shown in FIG. 4, step S1 comprises: depositing an amorphous silicon layer on the base substrate 1; performing high-temperature dehydrogenation; forming a polysilicon layer by excimer laser annealing; and forming a polysilicon silicon island, i.e., a pattern of the active layer 2, through a patterning process.

In some embodiments, before depositing the amorphous silicon layer, a buffer layer may be deposited on the base substrate 1 first, the buffer layer may be made of SiOx and/or SiNx.

Figure 5:
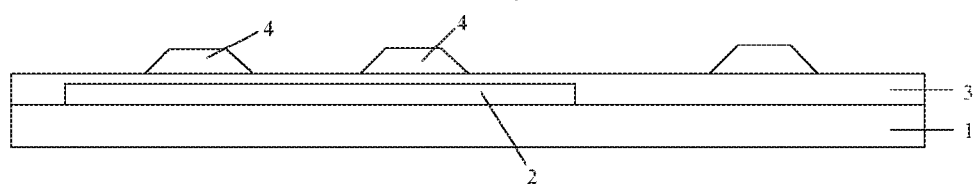
FIG. 5 is a schematic view of a structure formed after step S2 is finished in the method for fabricating an array substrate according to the embodiment of the present invention.

As shown in FIG. 5, step S2 comprises: depositing the gate insulating layer 3 on the base substrate 1 and the active layer 2; and forming a pattern of the gate 4 on the gate insulating layer 3.

In some embodiments, wirings are further provided on the gate insulating layer 3 to facilitate connection with the common electrode. In addition, after forming the pattern of the gate, ion implantation is performed in regions of the source and the drain by using the gate as a mask.

Figure 6:
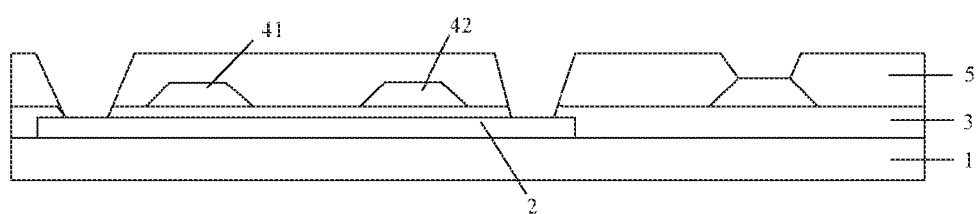
FIG. 6 is a schematic view of a structure formed after step S3 is finished in the method for fabricating an array substrate according to the embodiment of the present invention.

As shown in FIG. 6, step S3 comprises: depositing the passivation layer 5 on the gate insulating layer 3; and forming contact holes in the gate insulating layer 3 and the passivation layer 5.

In some embodiments, after forming the contact holes, a thermal annealing process is performed to activate the implanted ions. In addition, the passivation layer 5 may be formed of SiOx and SiNx, that is, the passivation layer 5 may comprise stacked layers respectively made of SiOx and SiNx.

Figure 7:
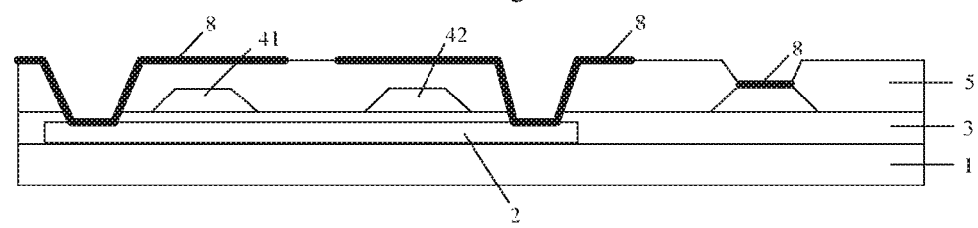
FIG. 7 is a schematic view of a structure formed after step S4 is finished in the method for fabricating an array substrate according to the embodiment of the present invention.

As shown in FIG. 7, step S4 comprises: forming a pattern of the conductive shading layer 8 on the passivation layer 5, such that the conductive shading layer 8 covers the contact holes, and is provided in a portion of region above the active layer 2, and thus, the conductive shading layer 8 functions as the "black matrix" in the region.

In some embodiments, the conductive shading layer 8 may be a titanium layer.

Figure 8:
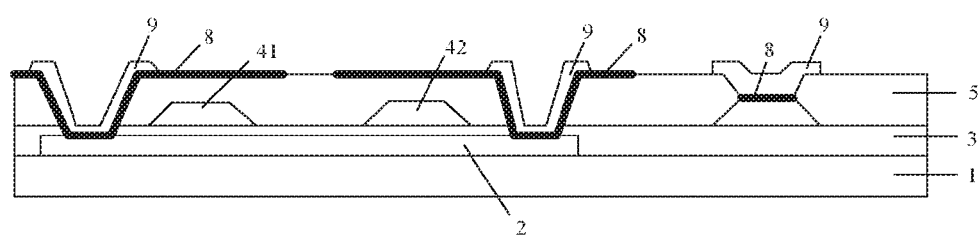
FIG. 8 is a schematic view of a structure formed after step S5 is finished in the method for fabricating an array substrate according to the embodiment of the present invention.

As shown in FIG. 8, step S5 comprises: forming a pattern of the copper layer 9 on the conductive shading layer 8 such that the copper layer 9 covers the contact holes.

Although FIG. 8 shows a case where the patterns of the conductive shading layer 8 and the copper layer 9 are different, in some embodiments, the patterns of the conductive shading layer 8 and the copper layer 9 may be the same, that is, the conductive shading layer 8 and the copper layer 9 are formed by one patterning process. By setting the copper layer 9 and the conductive shading layer 8 to have the same pattern, one etching process can be omitted, which causes the fabricating process to be easier.

The method for fabricating an array substrate according to the embodiment of the present invention can effectively avoid diffusion of copper into the active layer, and also omit the step for fabricating the black matrix layer, which simplifies the fabricating process.

The embodiment of the present invention further provides a display device including the above mentioned array substrate. The display device may be a product or a component having a display function, such as a liquid crystal display panel, an electronic paper, a mobile phone, a tablet computer, a TV set, a display, a laptop computer, a digital camera frame, a navigator, etc.

It could be understand that the above embodiments are merely exemplary embodiments used for describing the principle of the present invention, but the present invention is not limited thereto. Various variations and improvements may be made by those of ordinary skill in the art without departing from the spirit and essence of the disclosure, and these variations and improvements shall also be regarded as falling within the protection scope of the disclosure.

What is claimed is:

1. An array substrate comprising light-transmissive regions for display and shading regions, a plurality of thin film transistors being provided in the shading regions, the thin film transistor comprising: a base substrate; an active layer, a gate insulating layer, a gate and a passivation layer sequentially provided on the base substrate; and a source and a drain provided on the passivation layer, wherein
   each of the source and the drain comprises a conductive shading layer connected to the active layer and a copper layer provided on the conductive shading layer, the conductive shading layer is provided between the active layer and the copper layer,
   wherein the conductive shading layer of the source comprises a first portion and a second portion as an integral structure, and the conductive shading layer of the drain comprises a third portion and a fourth portion as an integral structure, the copper layer being on the first and third portions, and
   wherein boundaries of the second and fourth portions are configured to extend beyond boundaries of the copper layer, respectively.

2. The array substrate of claim 1, wherein the conductive shading layer is further provided in at least a portion of region above the active layer.

3. The array substrate of claim 1, wherein the second and fourth portions are above the active layer, and an interval is provided between the second portion and the fourth portion.

4. The array substrate of claim 1, wherein the second portion and the fourth portion function as a black matrix of the array substrate.

5. The array substrate of claim 1, wherein the gate comprises a first gate and a second gate, the conductive shading layer is provided above each of the first gate and the second gate.

6. The array substrate of claim 5, wherein an interval is provided between the conductive shading layer provided above the first gate and the conductive shading layer provided above the second gate, and the interval is located between the first gate and the second gate.

7. The array substrate of claim 1, wherein the conductive shading layer is further provided in at least a portion of region of the shading region other than the source and the drain.

8. The array substrate of claim 1, wherein the conductive shading layer comprises titanium.

9. The array substrate of claim 1, wherein the active layer comprises polysilicon.

10. The array substrate of claim 1, further comprising: a color filter layer provided at least in the light-transmissive regions.

11. A method for fabricating an array substrate, the array substrate comprising light-transmissive regions for display and shading regions, the method comprising fabricating thin film transistors in the shading region of a base substrate of the array substrate, the thin film transistor comprising an active layer, a gate insulating layer, a gate and a passivation layer sequentially provided on the base substrate, and a source and a drain provided on the passivation layer, wherein
   each of the source and the drain comprises a conductive shading layer connected to the active layer and a copper layer provided on the conductive shading layer, the conductive shading layer is provided between the active layer and the copper layer,
   wherein the conductive shading layer of the source comprises a first portion and a second portion as an integral structure, and the conductive shading layer of the drain comprises a third portion and a fourth portion as an integral structure, the copper layer being on the first and third portions, and
   wherein boundaries of the second and fourth portions are configured to extend beyond boundaries of the copper layer, respectively.

12. A display device, comprising the array substrate of claim 1.

13. The array substrate of claim 7, wherein wirings are further provided in the shading regions, and the conductive shading layer is further provided in at least a portion of region above the wirings.

14. The array substrate of claim 1, wherein a projection of the copper layer on the base substrate does not overlap with those of the second and fourth portions on the base substrate.

15. The method of claim 11, wherein a projection of the copper layer on the base substrate does not overlap with those of the second and fourth portions on the base substrate.

* * * * *